(12) United States Patent
Maggio et al.

(10) Patent No.: US 6,934,347 B2
(45) Date of Patent: Aug. 23, 2005

(54) METHOD FOR RECOVERING A CLOCK SIGNAL IN A TELECOMMUNICATIONS SYSTEM AND CIRCUIT THEREOF

(75) Inventors: Santo Maggio, Gorgonzola (IT); Paolo Taina, Vimercate (IT); Massimiliano Rutar, Carnate (IT)

(73) Assignee: Alcatel, Paris (FR)

( * ) Notice: Subject to any disclaimer, the term of this patent is extended or adjusted under 35 U.S.C. 154(b) by 772 days.

(21) Appl. No.: 09/736,294

(22) Filed: Dec. 15, 2000

(65) Prior Publication Data

US 2002/0126785 A1 Sep. 12, 2002

(30) Foreign Application Priority Data

Dec. 31, 1999 (IT) .......................................... TO99A1185

(51) Int. Cl.[7] ................................................ H03D 3/24
(52) U.S. Cl. .......................... 375/373; 340/3.2; 710/25; 375/376; 375/371
(58) Field of Search ................................. 375/373, 374, 375/376

(56) References Cited

U.S. PATENT DOCUMENTS

| | | | |
|---|---|---|---|
| 4,789,996 A | * 12/1988 | Butcher | |
| 5,081,655 A | 1/1992 | Long | |
| 5,371,766 A | * 12/1994 | Gersbach et al. | ........... 375/373 |
| 5,451,894 A | * 9/1995 | Guo | |
| 5,488,641 A | 1/1996 | Ozkan | |
| 5,614,855 A | * 3/1997 | Lee et al. | .................... 327/158 |
| 5,712,884 A | * 1/1998 | Jeong | ......................... 375/375 |
| 5,901,190 A | * 5/1999 | Lee | .............................. 375/373 |
| 6,247,138 B1 | * 6/2001 | Tamura et al. | |
| 6,484,268 B2 | * 11/2002 | Tamura et al. | |
| 6,636,979 B1 | * 10/2003 | Reddy et al. | ................ 713/503 |
| 2002/0101912 A1 | * 8/2002 | Phelts et al. | ................ 375/148 |

OTHER PUBLICATIONS

Delay length locked loop in target range tracking Balasubramanian, K. Rajaravivarma, V. Dept. of Comput. Sci. & Eng., Eur. Univ. of Lefke, Mersin, Turkey; This paper appears in: Southeastern Symposium on System Theory, 2001. Proceedings of the 33rd.*
A semidigital dual delay–locked up loop Sidiropoulos, S.; Horowitz, M.A.; □□Solid–State Circuits, IEEE Journal of, vol.: 32 , Issue: 11, Nov. 1997; pp.: 1683–1692.*
Patent Abstracts of Japan, vol. 011, No. 227, Jul. 23, 1987 corresponding to JP 62 043919 A (Meidensha Electric Mfg. Co. Ltd) dated Feb. 1987.
Patent Abstracts of Japan, vol. 008, No. 059, Mar. 17, 1984 correponding to JP 58 210724 A (Canon KK) dated Dec. 8, 1983.

* cited by examiner

Primary Examiner—Stephen Chin
Assistant Examiner—Harry Vartanian
(74) Attorney, Agent, or Firm—Sughrue Mion, PLLC

(57) ABSTRACT

Method for recovering a clock signal from an input data signal in a telecommunications system, that provides for comparing the input data signal with a recovered clock signal in order to control said recovered clock signal generation and provides for generating a plurality of delayed clock signals, obtained by multi-delaying at least a reference signal, said delayed clock signals being phase-shifted with respect to each other. According to the invention, said delayed clock signals show a phase shift with respect to each other, that is nominally constant in time, and, moreover, it is provided for selecting the recovered clock signal among said delayed clock signals.

16 Claims, 4 Drawing Sheets

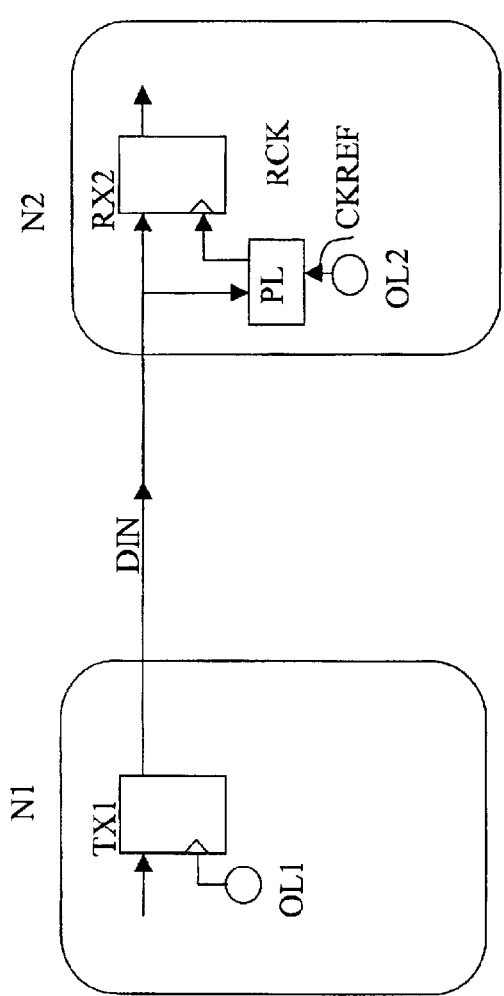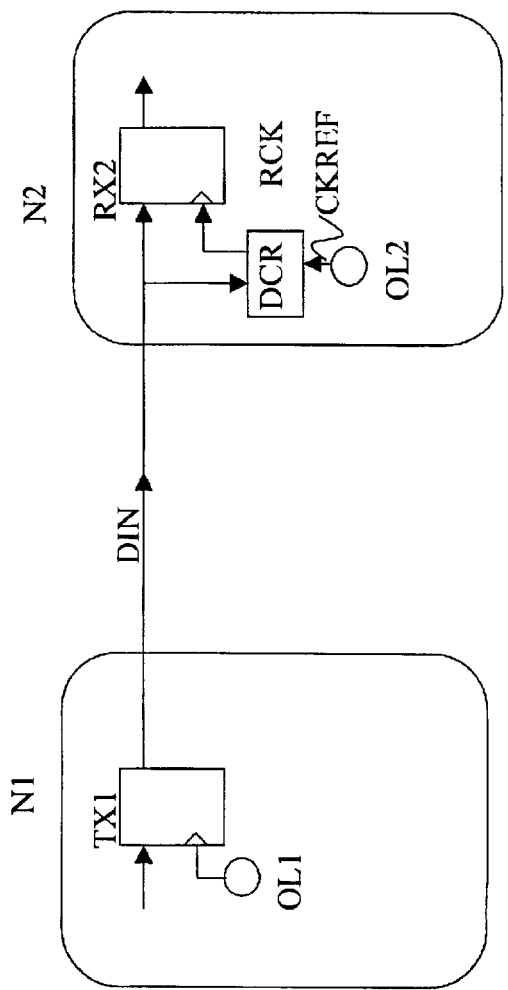

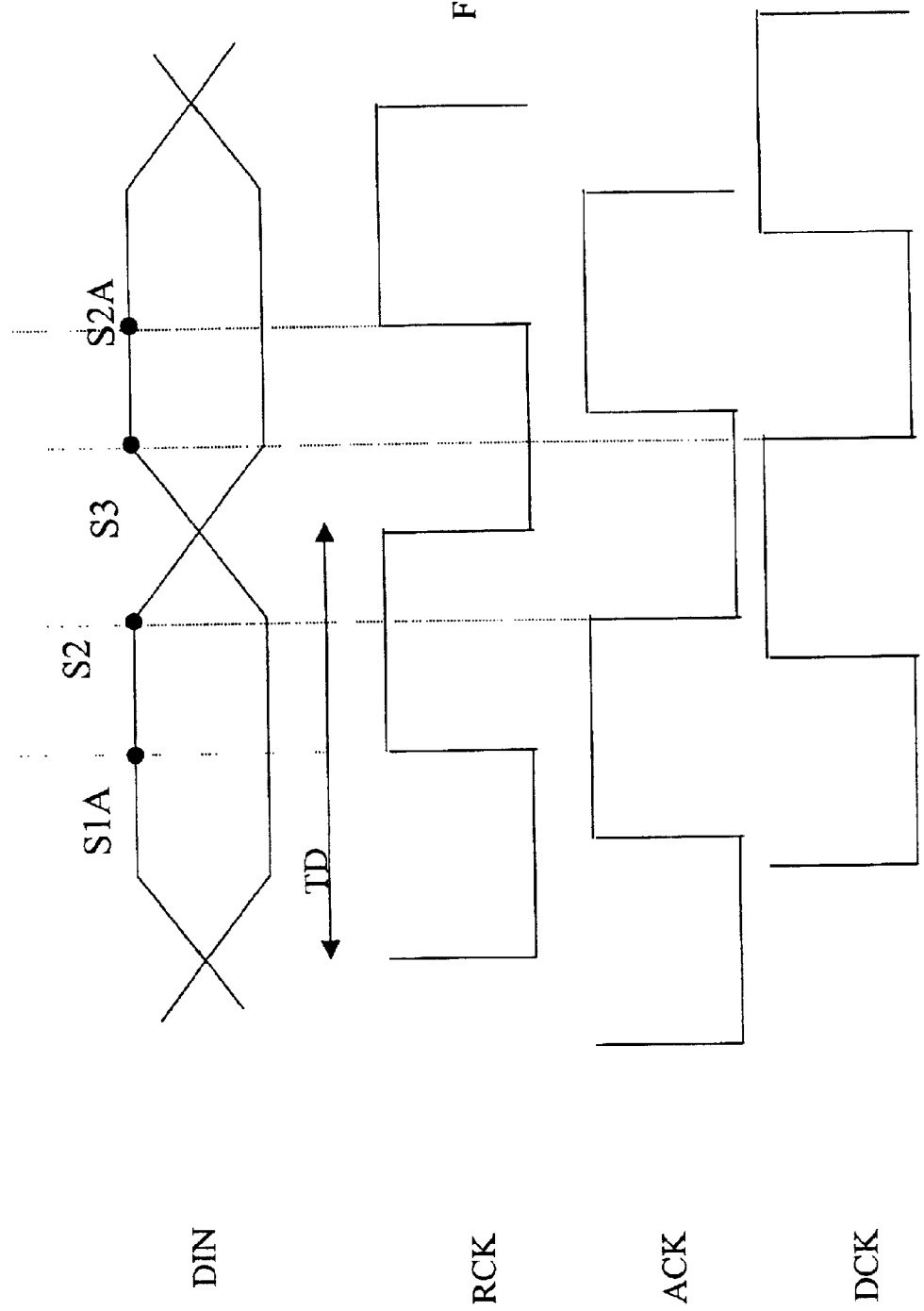

METHOD FOR RECOVERING A CLOCK SIGNAL IN A TELECOMMUNICATIONS SYSTEM AND CIRCUIT THEREOF

BACKGROUND OF THE INVENTION

1. Field of the Invention

The present invention relates to a method for recovering a clock signal from an input data signal in a telecommunications system.

2. Description of the Prior Art

When establishing digital communication systems, often the condition arises where a local oscillator generates the frequency for sending data to a remote receiver terminal, which by extracting clock information from the data themselves, e.g. through a PLL circuit (Phase Locked Loop), uses such a frequency to read the data received and clock its own transmission.

FIG. 1a is representing by way of example a basic diagram of a synchronous telecommunications network, such as SDH (Synchronous Data Hierarchy), where a first node N1 has a first local clock OL1. Said local clock OL1 supplies clock to a transmitter TX1. The first node N1 communicates with a second node N2 by sending a data signal DIN, said node having at its input a phase locked loop PL. Such a phase locked loop PL receives at its input a reference clock signal CKREF generated by a second local clock OL2. The local clock OL1 and local clock OL2 are synchronous by assumption, so that in principle the reference clock signal CKREF should be synchronous with the input data signal DIN, whereas the phase of said signals may be different. Moreover, some mistunes may also occur between said signals. Therefore, the phase locked loop PL will produce a recovered clock signal RCK, synchronous and in phase with the input data signal DIN for correct clocking of the operations of a receiver RX2, so that it is able to decode, by sampling, namely by performing a correct clocking, the data signal DIN which are transmitted according to the local clock OL1.

The phase locked loop PLL for recovering a clock signal is a solution commonly in use.

However, such a solution has some drawbacks due to the difficulty of obtaining high performances by means of the PLL loops, in particular at high frequencies, due to the noise and electric coupling with other circuits. In particular, these difficulties are enhanced in connection with SDH network data transmission.

Moreover, PLL loops appear to be strongly dependent on frequency, so that the use of the same PLL loop at a different frequency is not possible without redesigning the whole ring.

Also, the use of PLL loops notoriously introduces a 'jitter', i.e. a frequency distortion, which is reflected in phase changes.

As an alternative to phase locked loop rings, it is known to use delay locked loops also known as DLL loops (Delay Locked Loop).

DLL rings are also based on feedback rings with a delay line receiving an input clock signal and releasing on their output one or more signals which are delayed with respect to the clock signal. Therefore, a phase comparator controls the phase difference with respect to the signal to be tracked and consequently instructs a control logics driving the delay introduced by the delay line.

One problem associated to this type of circuits is that the delay elements of the delay lines practically have considerable deviations from said nominal delay or phase shift value. Consequently, rather high delay values should be used, so that the incidence of said deviation is less important. As a result, the partition that can be operated on the bit period of the input data signal cannot be a very fine one. Moreover, such DLL circuits make extremely difficult to track a strong jitter of input data.

SUMMARY OF THE INVENTION

The object of the present invention is to solve the above drawbacks and provide a method for recovering a clock signal from an input data signal in a telecommunications system having a more efficient and improved performance with respect to existing solutions.

In this frame, the main object of the present invention is to provide a method for recovering a clock signal from an input data signal in a telecommunications system, which is suitable for use at high frequencies.

A further object of the present invention is to provide a method for recovering a clock signal from an input data signal in a telecommunications system, whose design parameters have a low frequency dependence.

A further object of the present invention is to provide a method for recovering a clock signal from an input data signal in a telecommunications system, which allows the use of delay lines introducing a very small phase difference, therefore ensuring a high phase resolution.

A further object of the present invention is to provide a method for recovering a clock signal from an input data signal in a telecommunications system, which operates also in the instance of a very strong input jitter.

In order to achieve such objects, the present invention provides a method and/or a circuit for recovering a clock signal from an input data signal in a telecommunications system incorporating the features of the annexed claims, which form an integral part of the description herein.

Further objects, features and advantages of the present invention will become apparent from the following detailed description and annexed drawings, which are supplied by way of non limiting example.

BRIEF DESCRIPTION OF THE DRAWINGS

In the drawings:

FIG. 1a shows a block diagram illustrating a transmission and reception system implementing a method for recovering a clock signal from an input data signal in a telecommunications system according to the known state of the art;

FIG. 1b shows a block diagram illustrating a transmission and reception system implementing a method for recovering a clock signal from an input data signal in a telecommunications system according to the present invention;

FIG. 4 shows a signal time diagram as used in the circuit of FIG. 2.

DESCRIPTION OF THE BEST MODE FOR CARRYING OUT THE INVENTION

FIG. 1b is representing a basic diagram of a transmission and reception system similar to that of FIG. 1a, but employing a recovery circuit of the clock signal DCR according to the present invention. As it can be seen, said recovering circuit DCR according to the present invention replaces the phase locked loop PL of FIG. 1a, by operating in the same way on the input data signal DIN and by supplying the recovered clock signal RCK to the receiver RX2.

However, the recovery circuit for the clock signal DCR, as illustrated more clearly in the following description, is a digital circuit based on the use of a delay line generating a plurality of phases among which the most convenient recovered clock signal RCK should be selected.

Figure 2:
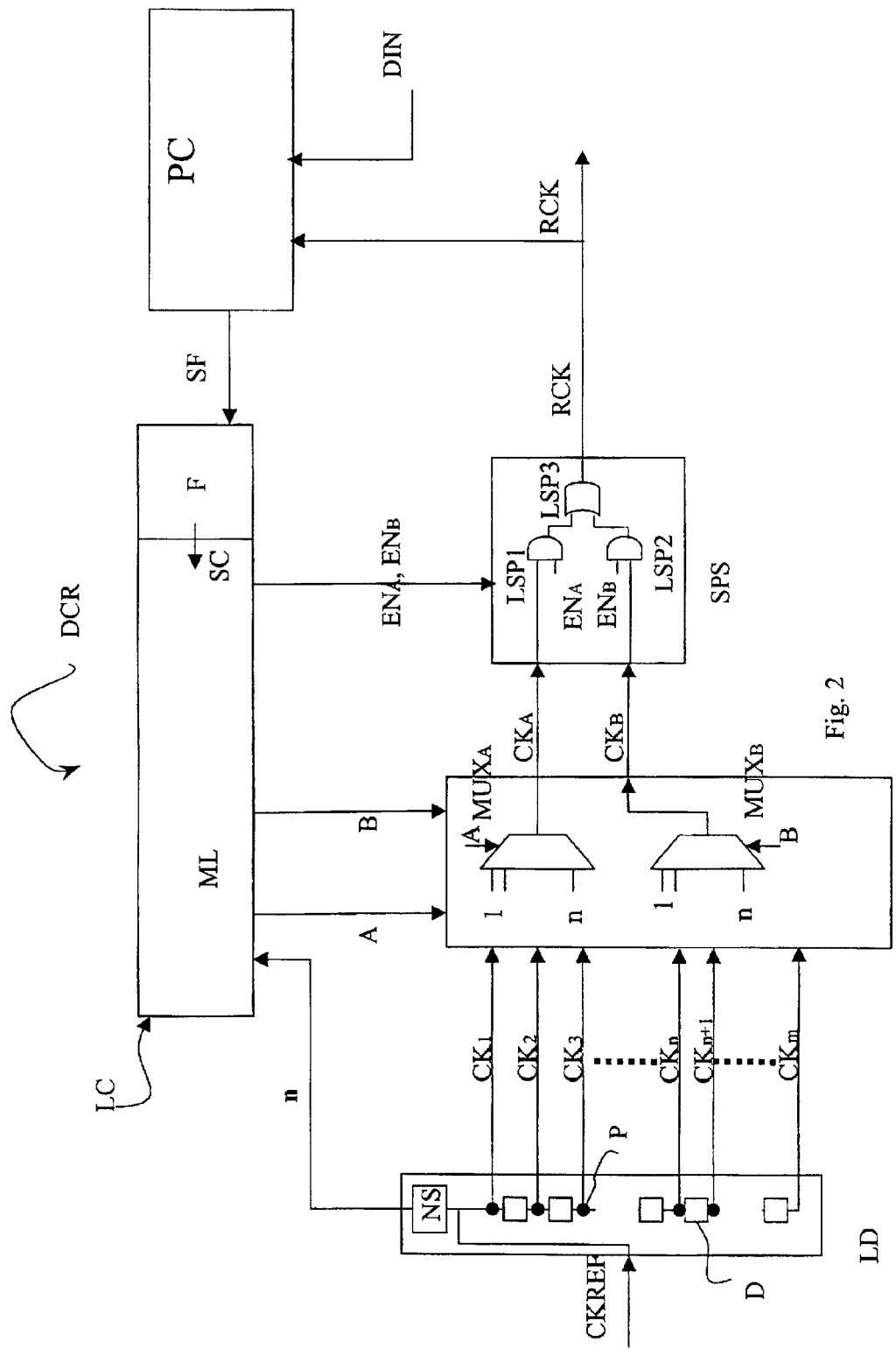
FIG. 2 shows a basic diagram of a circuit incorporating a method for recovering a clock signal from an input data signal in a telecommunications system according to the present invention.

FIG. 2 is representing a diagram of a clock signal recovery circuit DCR according to the present invention.

Said circuit comprises a delay block LD receiving at its input the reference clock signal CKREF and supplying at its output m equally delayed clock signals CK1 . . . CKm. Said equally delayed clock signals CKREF are phase shifted between each other by a delay or phase shift T.

The delay block LD is substantially obtained through a delay line, which comprises a plurality of delay elements D, each of them introducing a delay nominally equal to the delay T, and taps P from which increasingly delayed clock signals can be picked up. In case of a reference clock signal CKREF at 622 MHz frequency, i.e. with a 1600 ps bit period, it is possible to use a 100 ps delay T, which requires 16 taps P for covering such a bit period.

The delay block LD provides, as already mentioned, a fixed number m of equally delayed clock signals CK1, . . . CKm. Said equally delayed signals CK1 . . . CKm are supplied to a phase selector block PS, which operates only on the first n of the m equally delayed signals CK1 . . . CKm, i.e. on covering equally delayed signals CK1 . . . CKn, which are required for covering a bit period TD of the input data signal DIN. By way of example, n will be worth 16, whereas m is a larger integer number, chosen according to the amount of frequency drifts to be tracked.

The covering equally delayed signals CK1 . . . CKn are sent in parallel to a first multiplexer MUXA and second multiplexer MUXB, which issue a respective first recovery signal CKA and a second recovery signal CKB. Said first recovery signal CKA and second recovery signal CKB are sent to a synchronous switch block SPS, which is able to choose the signal, between the first recovery signal CKA and second recovery signal CKB, which should be used as a recovered clock signal RCK.

The recovered clock signal RCK is sent to a phase comparator PC along with the input data signal DIN. Said phase comparator PC issues a phase signal SF, which is sent to the input of a logic control block LC.

Said logic control block LC supervises operation of the clock signal recovery circuit DCR. From the delay line LD said logic control block LC receives, in fact, information about the number n of taps P of said delay line LD, which are used for covering the bit period TD of the input data signal DIN. The number n is supplied to the logic control block LC through a sensor circuit NS, whose operation is detailed in FIG. 3.

Moreover, from the phase comparator PC, said logic control block LC receives a phase signal SF containing information about the phase difference between the recovered clock signal RCK and the input data signal DIN.

The logic control block LC, according to said received information, issues a selection signal A of the first recovery signal CKA and a selection signal B of the second recovery signal CKB, which are sent to the respective first multiplexer MUXA and second multiplexer MUXB of the phase selector block PS. Moreover, said logic control block LC issues a first enable signal ENA and second enable signal ENB, which are sent to the synchronous switch block SPS. Said synchronous switch block SPS is illustrated schematically in FIG. 2 for simplicity's sake by two logic gates LSP1 and LSP2 receiving at one of their inputs the first recovery signal CKA and second recovery signal CKB, respectively, whereas at their other input they receive the first enable signal ENA and second enable signal ENB, respectively. The output of said logic gates LSP1 and LSP2 is sent to a third logic gate LSP3, which supplies on its output the recovered clock signal RCK, selected by the action on the first enable signal ENA and second enable signal ENB, as better illustrated hereafter.

The logic control block LC comprises a filter F and logic machine ML, i.e. a finite state machine. The filter F receives the phase signal SF and provides selection instructions SC to the logic machine ML.

The filter F consists substantially of an up/down counter.

Description of recovery circuit operation of the clock signal DCR now follows.

As stated above, the recovered clock signal RCK and input data signal are compared in the phase comparator PC. Through the filter F and selection instructions SC, the phase signal SF thus obtained supplies information relating to the amount of the phase difference to the finite state logic machine ML of the control logic block LC. Said control logic block LC, according to the information relating to the number n of equally delayed covering signals CK1 . . . CKn, issues a first selection signal A according to its internal rules coded in the finite state logic machine ML; by means of the first multiplexer MUXA, this signal will select among the covering equally delayed signals CK1 . . . CKn the recovery signal CKA that is most suitable for reducing the phase difference between the recovered clock signal RCK and input data signal DIN. Thus, the first recovery signal CKA will be selected.

Similarly, the control logic block LC selects also the second recovery signal CKB, through the second multiplexer MUXB and second selection signal B. The second recovery signal CKB is a clock signal shifted either in advance or in delay by one or more periods with respect to the first recovery signal CKA and corresponds to the subsequent correction applied by the control logic block LC.

After sending the first selection signal A or second selection signal B, the control logic block LC will send the first enable signal ENA and second enable signal ENB for driving the synchronous switch block SPS to switch between the first recovery signal CKA and second recovery signal CKB, as required. This determines an advanced or delayed phase shift in the recovered clock signal CKR at the output of said synchronous switch block SPS.

After the synchronous switch block SPS has switched, the filter F counter is reset by bringing its value to the middle of its variation range, and the filter F will resume storage of information coming through the phase signal SF following a comparison between the input data signal DIN and recovered clock signal RCK, which has now undergone a phase shift as described.

Figure 3:
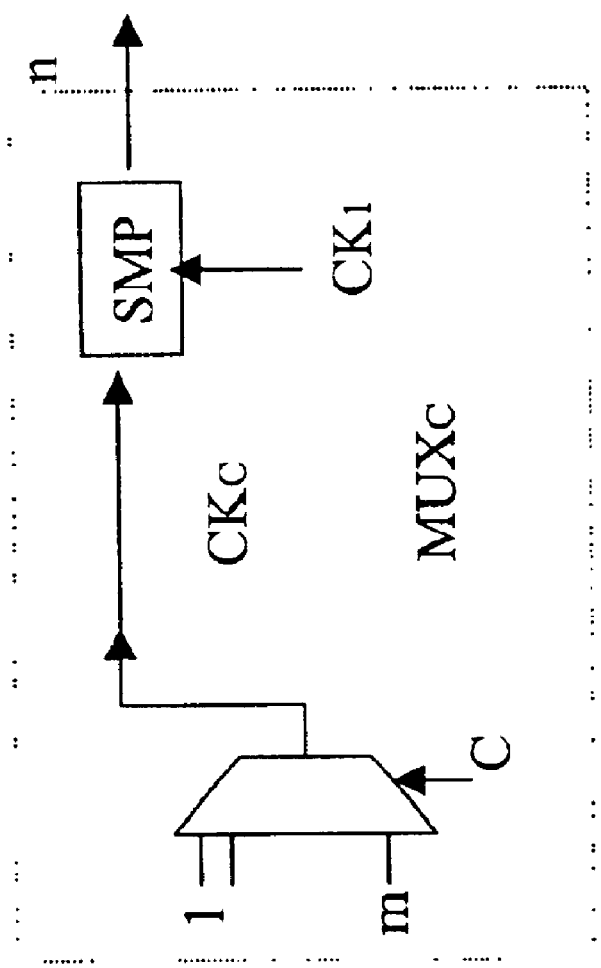
FIG. 3 shows a basic diagram of a detail of the circuit incorporating the method for recovering a clock signal from an input data signal in a telecommunications system of FIG. 2.

In FIG. 3 the sensor circuit NS is represented, which comprises a multiplexer MUXc receiving at its input the m equally delayed signals CK1 . . . CKn, and is driven by a counter signal C, generated by a time base not shown here. The counter signal C drives the multiplexer MUXc, so that at its output, that is a clocked signal CKc, all equally delayed signals CK1 . . . CKm will be subsequently available within the time of a bit period TD. The clocked signal CKc is then sent to a sampler SMP using the clock signal CK1 as a reference, i.e. the signal coinciding with the reference signal CKREF. The sampler SMP will detect when the comparison with the clock signal CK1 produces a logic zero, since the clock signal CKc has the same phase of the clock signal CK1, and the value of the counter signal C corresponds to the number n of spaced equally delayed covering signals CK1 . . . CKn of the bit period TD.

In FIG. 4 a time diagram of the signals used by the phase comparator PC is shown, the diagram will be used for a more detailed description of the operation of the phase comparator PC, of the control logic block LC and of the synchronous switch SPS.

The input data signal DIN, the recovered clock signal RCK, and an advanced signal ACK and delayed signal DCK are shown, corresponding to clock signals which are advanced and delayed respectively, of a delay T with respect to the input data signal transition DIN of a delay T.

Thus, the transitions of the recovered clock signal, of the advanced signal ACK and delayed signal DCK, used as sampling signals by the phase comparator PC, identify four samples S1A, S2, S3 and S1B. At each period of the clock signal the phase comparator PC picks up four samples and one of the following conditions may occur:

- all samples S1A, S2, S3, S1B are equal (for example two consecutive equal bits): the phase comparator PC sends a maintaining signal M as a phase signal SF;
- S1A and S2 are equal, S3 and S1B are equal, but both couples differ from each other; the phase comparator PC sends a hold signal MT as a phase signal SF;
- S1A, S2, S3 are equal but differ from S1B; this means that the sampling signal, i.e. the recovered clock signal RCK must be delayed: the phase comparator PC sends a delay signal DY as a phase signal SF;
- S2, S3, S1B are equal but differ from S1A; this means that the sampling signal, i.e. the recovered clock signal RCK must be advanced: the phase comparator PC sends an advanced signal AD as a phase signal SF;
- an unusual condition is detected (e.g. S1A and S1B are equal, S2 and S3 are equal but the pairs differ. This may happen if the recovered clock signal CKR is close to the transition of the input data signal DIN and the signals ACK and DCK are close to the bit centre); a drift signal DR is sent, which is able to displace the phase of the clock signal of an eighth of period to remove the unusual condition.

The hold signal MT, advance signal AD, delay signal DY and drift signal DR form the contents of the phase signal SF, which is sent to the counter forming the filter F. Said up/down counter:

- increases by 1 if receiving the delay signal DY;
- decreases by 1 if receiving the advance signal AD;
- remains unchanged if receiving the hold signal MT.

When the filter counter F reaches its maximum, it will issue a clock delay instruction MDC, which is sent to the state machine ML. When the filter counter F, on the contrary, reaches its minimum, it will issue a clock advance instruction MAC to the state machine ML.

The delay instruction of the clock MDC and clock advance instruction MAC correspond to the selection instructions SC mentioned above.

The state machine ML receives the selection instructions SC and generates the first selection signal A (or second selection signal B) according to the following rules:

When it receives a clock delay instruction MDC, it will select one among the covering equally delayed signals CK1 . . . CKn at the input of the first multiplexer MUXA (or second multiplexer MUXB) being delayed by a delay T with respect to the signal which has been last selected; if the signal last selected is the one with a maximum delay obtainable from the delay block DL, i.e. the signal CKn, the new signal selected by the first selection signal A (or second selection signal B) will be signal CK1;

When it receives a clock advance instruction MAC, it will select one among the covering equally delayed signals CK1 . . . CKn at the input of the first multiplexer MUXA (or second multiplexer MUXB) advanced by a delay T with respect to the one last selected; if the signal last selected is the one with a minimum delay obtainable from the delay block DL, i.e. the signal CK1, the new signal selected by the first selection signal A (or second selection signal B) will be signal CKn.

As said, the synchronous switch block SPS acts subsequently and the recovery signal CKA and recovery signal CKB are simultaneously present at the output of the synchronous switch block SPS for a time of about half a clock period after switching, so as to allow a transition in spite of a very high operating frequency (622 MHz). The first enable signal ENA and second enable signal ENB are used to inhibit operation of the synchronous switch block SPS in the intervals during which the so-called "glitch", i.e. sporadic transitions, may occur at the output, due to the logics applied and signal levels.

The phase comparator PC described above is a particularly simplified construction for clarity's sake, but its capacities can be easily increased for operation on a larger number of signals, such as signals ACK and DCK. For example, provision of two further clock signals, either advance or delay shifted by two delays T, makes it possible to have six samples for each period of the input data signal DIN, so that e.g. an advance signal AD and a strong advance signal ADF can be supplied in the phase signal SF. The filter F, will increment the counter by 1 upon receiving the advance signal AD and increment said counter by 2 upon receiving the strong advance signal ADF, thus favouring a faster convergence of the recovery circuit of the clock signal DCR. The same applies for the delay signals.

The number n of taps P of the delay block LD for covering the bit period of the input data signal DIN, as highlighted in the previous description, is variable on time, so as to track likely drifts of the input data signal DIN.

Moreover, it is obvious that the practical construction of the phase comparator PC will be quite different from the description above concerning its operation principles. For example, it will be appropriate to use only the recovered clock signal RCK and obtain the signals ACK and DCK, as well as any further shifted signals to be used, through the taps of a delay line contained inside the same phase comparator PC.

Moreover, for practical execution, in order to minimize the connections for performing sampling as described in FIG. 3, in reality the input data signal DIN will be the one to go through the delay lines of the phase comparator PC, which are now either advanced or shifted, and the various phases of the input data signal DIN so obtained will be compared with the sole recovered clock signal RCK.

Thus, there also no need to provide a plurality of blocks SPS (three in the above example).

From the above description the features of the present invention as well as the relevant advantages thereof are clear.

The method for recovering a clock signal from an input data signal in a telecommunications system according to the present invention provides advantageously a digital circuit with a high noise immunity, as being a digital circuit and because the data is sampled only once. Moreover, many circuits can be provided on one same chip, because being the circuit according to the present invention a digital circuit, it will not cause any couplings between different circuit parts.

Advantageously, it is also possible to obtain delay lines introducing a very small delay, and have a high phase resolution, since a nominally fixed delay between the taps of the delay line is used and the number n of taps employed by the circuit is dynamically changed according to a comparison between the sum of delays and the bit period. Thus, both the tolerances and drifts of the delay line do not seriously influence, since the recovery circuit of the clock signal according to the present invention is based on the real delay introduced by the delay line, as measured from time to time through the number of active taps.

This, advantageously, allows to use delay elements introducing small delay values.

Moreover, advantageously, the method for recovering a clock signal from an input data signal in a telecommunications system and the relevant circuit show a very low dependence on the operating frequency, as it is possible to easily shift the delay imposed by the delay line and cover a new bit period with said changed delay.

Moreover, advantageously, the method for recovering a clock signal from an input data signal in a telecommunications system according to the present invention and the circuit thereof operate also in the instance of an unlimited input jitter thanks to the capacity of ensuring a fast convergence.

Through this feature, the method for recovering a clock signal from an input data signal in a telecommunications system according to the present invention and the circuit thereof is e.g. suitable to perform a 'dejittering' function should a low frequency system clock, that is frequency multiplied by an analog PLL, be used.

There has thus been shown and described a novel method and a novel circuit which fulfill all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method for recovering a clock signal from an input data signal in a telecommunications system, the method comprising:
   comparing said input data signal with a recovered clock signal in order to control a recovered clock signal generation;
   generating a plurality of delayed clock signals, obtained by multi-delaying at least a reference signal, said delayed clock signals being phase-shifted with respect to each other;
   selecting said recovered clock signal among said delayed clock signals;
   employing a number of delayed signals, such that a sum of shifts associated with said delayed signals covers a bit period of said input data signal; and dynamically changing said number of delayed signals by comparing said bit period with said sum of shifts;
   wherein said delayed clock signals show a phase shift with respect to each other, that is nominally constant in time.

2. The method according to claim 1, wherein a shift between each adjacent pair of delayed signals is nominally equal.

3. The method according to claim 1, further comprising obtaining said plurality of delayed clock signals by multi-delaying a single sole reference signal.

4. The method according to claim 2, further comprising selecting a first recovery signal and a second signal before selecting said recovered clock signal.

5. The method according to claim 4, further comprising switching between said first recovery signal and said second recovery signal for selecting said recovered clock signal.

6. The method according to claim 4, further comprising shifting said first recovery signal and said second recovery signal by one time interval.

7. The method according to claim 5, further comprising shifting said first recovery signal and said second recovery signal by one time interval.

8. The method according to claim 4, further comprising providing enabling signals for activating switching between said first recovery signal and said second recovery signal.

9. A method for recovering a clock signal from an input data signal in a telecommunications system, the method comprising:
   comparing said input data signal with a recovered clock signal in order to control a recovered clock signal generation;
   generating a plurality of delayed clock signals, obtained by multi-delaying at least a reference signal, said delayed clock signals being phase-shifted with respect to each other;
   selecting said recovered clock signal among said delayed clock signals;
   employing a number of delayed signals, such that a sum of shifts associated with said delayed signals covers a bit period of said input data signal;
   performing a comparison operation which includes comparing said input data signal with said recovered clock signal, by using a comparison of several phases of at least one of said input data signal and said recovered clock signal, so as to obtain a plurality of samples for each sampling cycle; and
   filtering an output of said comparison operation;
   wherein said delayed clock signals show a phase shift with respect to each other, that is nominally constant in time.

10. A circuit for recovering a clock signal from an input data signal in a telecommunications network, comprising:
   a generating means configured to generate a recovery clock signal; and
   a phase comparator configured to compare said input data signal phase and said recovery clock signal phase for supplying a phase information, which controls said generating means of said recovery clock signal; and
   a selection means;
   wherein said generating means further comprises a delay line having a plurality of taps for generating a plurality of delayed signals;
   wherein a sum of shifts associated with said delayed signals covers a bit period of said input data signal; and
   wherein said selection means comprises:
      a selection block for selecting a first recovery signal and a second recovery signal from said plurality of delayed signals; and a switch block for switching between said first recovery signal and said second recovery signal.

11. A circuit for recovering a clock signal from an input data signal in a telecommunications network, comprising:

a generating means configured to generate a recovery clock signal; and a phase comparator configured to compare said input data signal phase and said recovery clock signal phase for supplying a phase information, which controls said generating means of said recovery clock signal;

wherein said generating means further comprises a delay line having a plurality of taps for generating a plurality of delayed signals;

wherein a sum of shifts associated with said delayed signals covers a bit period of said input data signal;

wherein said generating means comprises a selection means of said recovered clock signal;

wherein said selection means further comprises a control logic driving a selection block and a switch block according to said phase information supplied by said phase comparator; and wherein said control logic comprises a filter for filtering said phase information.

12. A circuit for recovering a clock signal from an input data signal in a telecommunications network, comprising:

a generating means configured to generate a recovery clock signal; and a phase comparator configured to compare said input data signal phase and said recovery clock signal phase for supplying a phase information, which controls said generating means of said recovery clock signal;

wherein said generating means further comprises a delay line having a plurality of taps for generating a plurality of delayed signals;

wherein a sum of shifts associated with said delayed signals covers a bit period of said input data signal;

wherein said generating means comprises a selection means of said recovered clock signal;

wherein said selection means further comprises a control logic driving a selection block and a switch block according to said phase information supplied by said phase comparator; and wherein said control logic comprises a logic machine issuing selection signals and enable signals according to said phase information.

13. A circuit for recovering a clock signal from an input data signal in a telecommunications network, comprising:

a generating means configured to generate a recovery clock signal;

a phase comparator configured to compare said input data signal phase and said recovery clock signal phase for supplying a phase information, which controls said generating means of said recovery clock signal;

a selection means;

wherein said generating means comprises a delay line having a plurality of taps for generating a plurality of delayed signals;

wherein said selection means comprises a selection block for selecting a first recovery signal and a second recovery signal from said plurality of delayed signals, and further comprises a switch block for switching between said first recovery signal and said second recovery signal.

14. The circuit according to claim 13, further comprising a control logic configured to drive said selection block and said switch block according to said phase information supplied by said phase comparator.

15. The circuit according to claim 14, wherein said control logic comprises a filter for filtering the phase information.

16. The circuit according to claim 14, wherein said control logic comprises a logic machine issuing selection signals and enable signals according to the phase information.

* * * * *